United States Patent
Nakatani et al.

(10) Patent No.: US 10,866,272 B2
(45) Date of Patent: Dec. 15, 2020

(54) SIMULATION CIRCUIT AND SIMULATION METHOD

(71) Applicant: Mitsubishi Electric Corporation, Tokyo (JP)

(72) Inventors: Takahiro Nakatani, Tokyo (JP); Katsumi Uryu, Tokyo (JP); Tadaharu Minato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/557,773

(22) Filed: Aug. 30, 2019

(65) Prior Publication Data

US 2020/0158774 A1 May 21, 2020

(30) Foreign Application Priority Data

Nov. 21, 2018 (JP) .................. 2018-217987

(51) Int. Cl.
| | |
|---|---|
| *G01R 31/26* | (2020.01) |
| *H03K 17/687* | (2006.01) |
| *G06F 30/36* | (2020.01) |
| *G06F 30/367* | (2020.01) |
| *G06F 30/00* | (2020.01) |
| *G06F 30/20* | (2020.01) |
| *H03K 17/06* | (2006.01) |

(52) U.S. Cl.
CPC ......... *G01R 31/2621* (2013.01); *G06F 30/36* (2020.01); *G06F 30/367* (2020.01); *H03K 17/687* (2013.01); *G06F 30/00* (2020.01); *G06F 30/20* (2020.01); *H03K 17/063* (2013.01)

(58) Field of Classification Search
CPC ... G01R 31/2621; G06F 30/36; G06F 30/367; G06F 30/00; G06F 30/20; H03K 17/04106; H03K 17/6871; H03K 17/687; H03K 17/063; H02M 1/08; H02M 2001/0058; Y02B 70/149
See application file for complete search history.

(56) References Cited

U.S. PATENT DOCUMENTS

| | | | | |
|---|---|---|---|---|
| 4,402,033 A | * | 8/1983 | Mayer | ............. H01H 47/32 361/187 |
| 5,140,201 A | * | 8/1992 | Uenishi | ............. H03K 17/0406 327/108 |
| 5,365,123 A | * | 11/1994 | Nakase | ............. H03K 19/013 326/109 |
| 6,631,505 B2 | * | 10/2003 | Arai | ............. G06F 30/367 716/106 |

(Continued)

FOREIGN PATENT DOCUMENTS

JP     2010-211387 A     9/2010

*Primary Examiner* — Helen Rossoshek
(74) *Attorney, Agent, or Firm* — Studebaker & Brackett PC (57) ABSTRACT

The object is to provide a technique for adjusting a turn-on operation and a turn-off operation of a transistor independently from each other in simulation for evaluating characteristics of the transistor. A simulation circuit for simulation for evaluating characteristics of a transistor includes a gate power supply configured to apply a voltage to a gate terminal of the transistor, a first diode connected between the gate terminal and the gate power supply, and a second diode connected in antiparallel with the first diode.

14 Claims, 10 Drawing Sheets

(56) References Cited

U.S. PATENT DOCUMENTS

| | | | |
|---|---|---|---|
| 7,735,033 B2* | 6/2010 | Zhang | G06F 30/367 |
| | | | 716/136 |
| 8,489,378 B2* | 7/2013 | Li | G06F 30/367 |
| | | | 703/14 |
| 8,519,748 B2* | 8/2013 | Aoki | H01L 27/0255 |
| | | | 327/108 |
| 9,590,616 B2* | 3/2017 | Inoue | H01L 29/7397 |
| 9,699,848 B2* | 7/2017 | Herfurth | H02M 3/156 |
| 2001/0002707 A1* | 6/2001 | Kumashiro | G06F 30/367 |
| | | | 257/288 |
| 2009/0164196 A1* | 6/2009 | Saitou | G06F 30/367 |
| | | | 703/14 |
| 2019/0190514 A1* | 6/2019 | Ohashi | H03K 17/08128 |

* cited by examiner

SIMULATION CIRCUIT AND SIMULATION METHOD

BACKGROUND OF THE INVENTION

Field of the Invention

The technique disclosed in the specification relates to a simulation circuit and a simulation method.

Description of the Background Art

Generally, in the development of a power electronic device such as an inverter, first, a circuit configuration is simulation-analyzed and then is subject to verification by trial evaluation.

For example, circuit simulation using a Simulation Program with Integrated Circuit Emphasis (SPICE) model is used for the above simulation analysis.

The above SPICE model is a model that simulates the electrical characteristics of a power semiconductor device, such as a diode, a metal-oxide-semiconductor field-effect transistor (i.e. a MOSFET) or an insulated gate bipolar transistor (i.e. an IGBT).

In order to accurately simulate the electrical characteristics, physical parameters for the device model are required to be extracted. Therefore, advanced knowledge on semiconductor physics is required.

However, circuit designers are generally not required much knowledge on semiconductor physics in many cases; therefore, a method extracting physical parameters with high accuracy without knowledge of semiconductor physics has been sought. As a method for solving such a problem, for example, a method as described in Japanese Patent Application Laid-Open No. 2010-211387 has been known.

Meanwhile, the switching operation of the power transistor is greatly affected by the input capacitance and the feedback capacitance of the power transistor. This is because, in the switching-on operation (turn-on operation) of the power transistor, the power transistor switches from the off state to the on state through a process in which charge is accumulated in the gate electrode of the power transistor, the capacitance value that determines the amount of charge accumulation affects the operating speed of the power transistor. In the switching-off operation (turn-off operation) of the power transistor, the power transistor is switched from the on state to the off state through the process of discharging the charge accumulated in the gate electrode.

Therefore, when simulating the switching operation of the power transistor, it is necessary to match the input capacitance and the feedback capacitance of the power transistor with the measured values with high accuracy.

In order to match the input capacitance and the feedback capacitance of the power transistor with the measured values with high accuracy, in Japanese Patent Application Laid-Open No. 2010-211387, the above matching is conducted by connecting an external variable capacitor $C_{dg}$ which follows the time variation of a drain-gate voltage $V_{dg}$ during the turn-off operation of the power transistor in parallel with the gate-drain terminal of the transistor so as to bring the simulation capacitance value closer to the measured value.

However, the above method has the following problems. That is, the characteristics of the turn-off operation (specifically, a voltage value, a current value, and a rate of change thereof, etc. at turn-off operation) are adjustable by the correction using the externally variable capacitor $C_{dg}$. However, the characteristics of the turn-on operation (specifically, a voltage value, a current value and the speed of their change, etc. during the turn-on operation) may also be changed unintentionally due to the correction using the external variable capacitor $C_{dg}$.

SUMMARY

A technique disclosed in the present specification is the technique for adjusting a turn-on operation and a turn-off operation of a transistor independently from each other in simulation for evaluating characteristics of the transistor.

The first aspect of the technique disclosed in the present specification is a simulation circuit for simulation for evaluating the characteristics of the transistor, and the transistor includes a gate power supply configured to apply a voltage to a gate terminal, a first diode connected between the gate terminal and the gate power supply, and a second diode connected in antiparallel with the first diode of the transistor.

Also, the second aspect of the technique disclosed in the present specification is a simulation method for evaluating the characteristics of the transistor by using a simulation circuit including a gate power supply configured to apply a voltage to a gate terminal, a first diode connected between the gate terminal and the gate power supply, and a second diode connected in antiparallel with the first diode of the transistor.

According to the first and second aspects of the techniques disclosed in the present specification, by arranging the first diode and the second diode in antiparallel between the gate terminal and the gate power supply of the transistor, in the turn-on operation and the turn-off operation, charging and discharging are executed through different paths. Thus, adjustment for the turn-on operation and the turn-off operation of the transistor can be executed independently from each other.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, Embodiments are described with reference to the accompanying drawings. And the example of the effect exhibited by each Embodiment is collectively described after the description of all Embodiments.

It should be noted that the drawings are schematically illustrated and, therefore, the configuration is, appropriately omitted or simplified for facilitating the description. Also, the mutual relationship between the sizes and positions of the configurations and so forth respectively illustrated in the different drawings is not necessarily precise and can be appropriately changed. In addition, in the drawings such as plan views that are not cross-sectional views, hatching may be given to facilitate understanding of the contents of Embodiments.

In addition, in the following description, the same components are denoted by the same reference numerals, and the names and functions thereof are also similar. Therefore, detailed description thereof may be omitted to avoid redundancy.

Further, in the following description, even when ordinal numbers such as "first" or "second" are stated, the terms are used to facilitate understanding of Embodiments, and therefore, the usage of the ordinal umbers does not limit the indication of the ordinal numbers to ordering.

Embodiment 1

Hereinafter, a simulation circuit and a simulation method of Embodiment 1 will be described. For convenience of description, first, the switching operation of the power transistor as a transistor relating to Embodiment 1 will be described.

Figure 1:
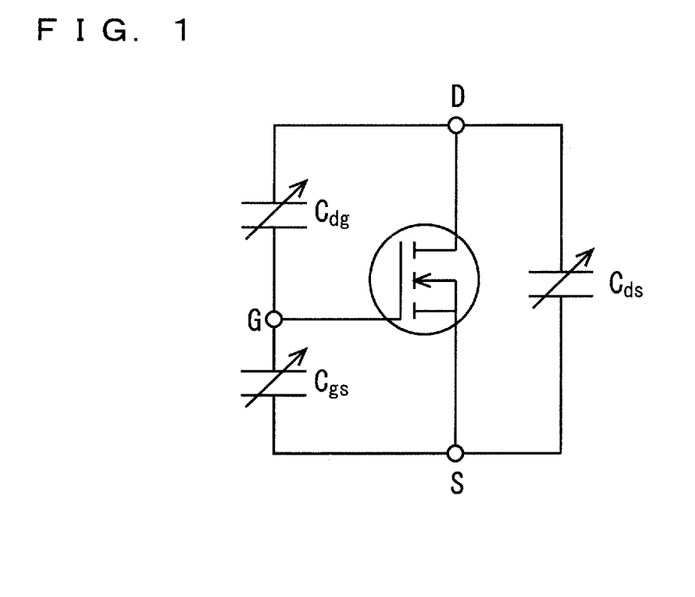
FIG. 1 is a circuit diagram of a simulation circuit using for switching simulation of a power transistor relating to Embodiment.

FIG. 1 is a circuit diagram of a simulation circuit using for switching simulation of a power transistor relating to Embodiment 1. Here, the simulation circuit represents a virtual circuit used for simulation. The simulation circuit is input in, for example, a computer, and is further displayed on a simulator. As illustrated in FIG. 1, an external variable capacitor $C_{dg}$ which follows the time variation of the drain-gate voltage $V_{dg}$ is connected in parallel with the gate-drain terminal of the power transistor. An external variable capacitor $C_{gs}$ which follows the time variation of the gate-source voltage $V_{gs}$ is connected in parallel with a gate-source terminal of the power transistor. An external variable capacitor $C_{ds}$ which follows the time variation of the drain-source voltage $V_{ds}$ is connected in parallel with a drain-source terminal of the power transistor.

As illustrated in FIG. 1, in order to match the input capacitance and the feedback capacitance of the power transistor with the measured values with high accuracy, the external variable capacitor $C_{dg}$ which follows the time variation of the drain-gate voltage $V_{dg}$ during the turn-off operation is connected in parallel with the gate-drain terminal of the power transistor. And the above matching is conducted by bringing the simulation capacitance value closer to the measured value.

However, the characteristics of the turn-off operation are adjustable by the correction using the externally variable capacitor $C_{dg}$. However, the characteristics of the turn-on operation may also be changed unintentionally due to the correction using the external variable capacitor $C_{dg}$.

Figure 2:
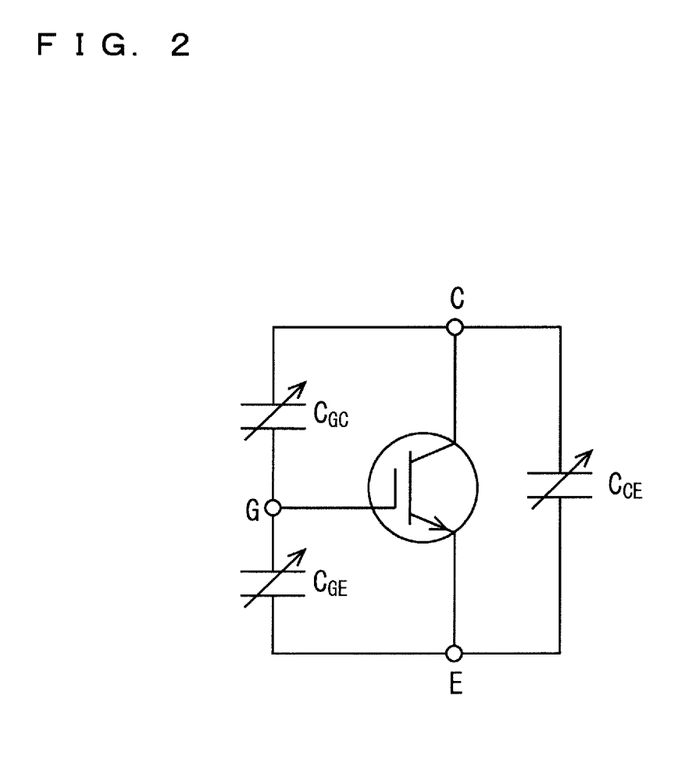
FIG. 2 is a circuit diagram of the simulation circuit using for switching simulation of an IGBT relating to Embodiment.

FIG. 2 is a circuit diagram of the simulation circuit using for the switching simulation of an IGBT relating to Embodiment 1. As an example illustrated in FIG. 2, the IGBT connects an external variable capacitor $C_{GC}$ which follows the time variation of the gate-collector voltage $V_{GC}$ in parallel with a gate-collector terminal of the transistor. Also, the IGBT connects an external variable capacitor $C_{GE}$ which follows the time variation of the gate-emitter voltage $V_{GE}$ in parallel with a gate-emitter terminal of the transistor. Further, the IGBT connects an external variable capacitor $C_{CE}$ which follows the time variation of the collector-emitter voltage $V_{CE}$ in parallel with a collector-emitter terminal of the transistor.

Figure 3:
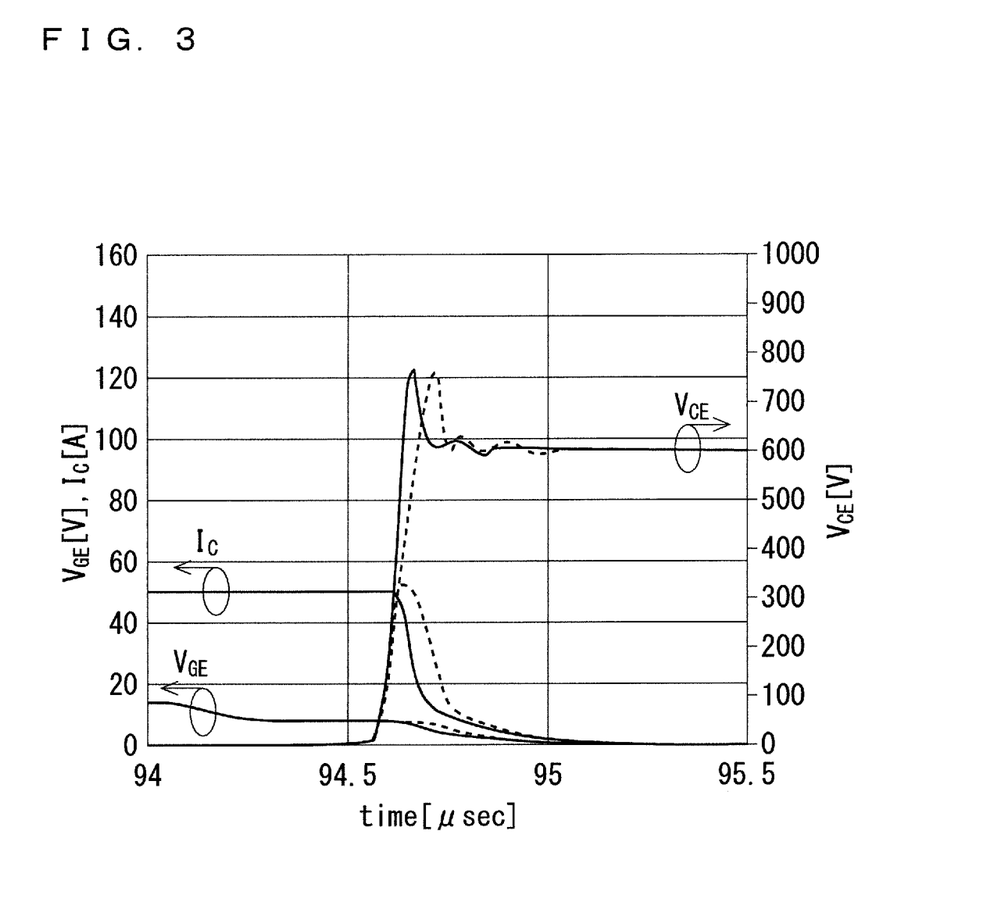
FIG. 3 is a graph illustrating results of simulating the characteristics of the switching operation (turn-off operation) using the IGBT, the example of which is illustrated in FIG. 2.

FIG. 3 is a graph illustrating results of simulating the characteristics of the switching operation (turn-off operation) using the IGBT, the example of which is illustrated in FIG. 2. In FIG. 3, the vertical axis represents the voltage $V_{GE}$ [V], the voltage $V_{CE}$ [V], and the current IC [A] flowing through the IGBT, and the horizontal axis represents time [μs].

Further, in FIG. 3, the waveform shown by the solid line corresponds to the case where the external variable capacitor $C_{GC}$ is 0, and the waveform shown by the dotted line corresponds to the case where the external variable capacitor $C_{GC}$ is 50 nF.

Figure 4:
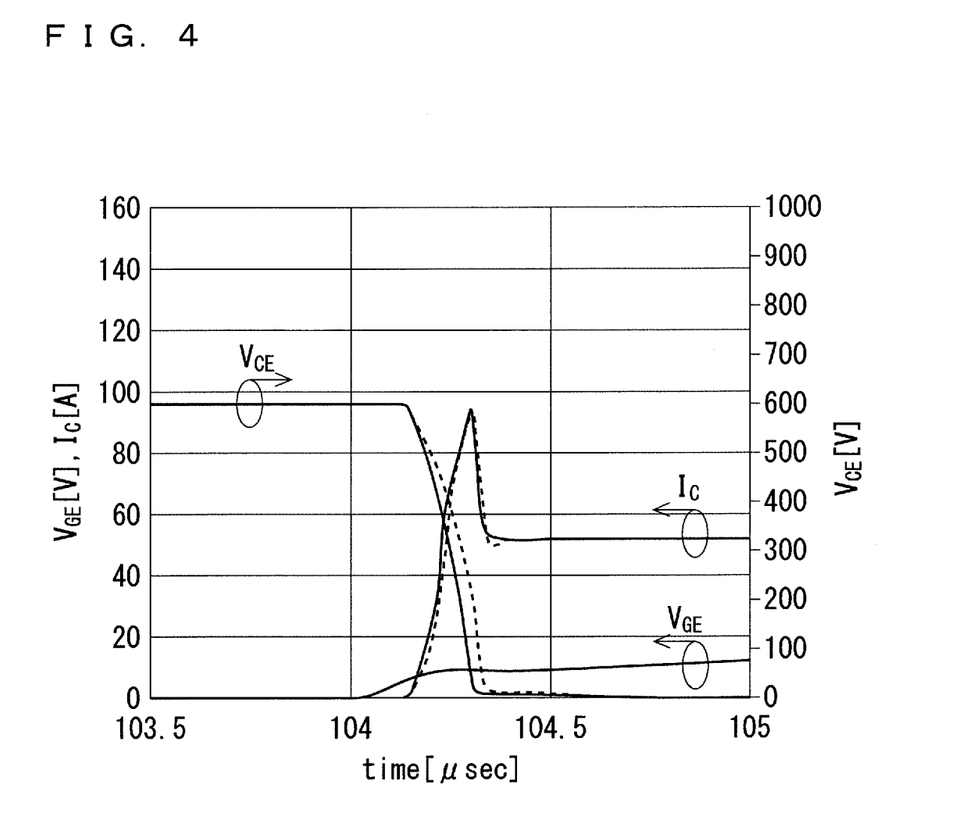
FIG. 4 is a graph illustrating results of simulating the characteristics of the switching operation (turn-on operation) using the IGBT, the example of which is illustrated in FIG. 2.

Further, FIG. 4 is a graph illustrating results of simulating the characteristics of the switching operation (turn-on operation) using the IGBT, the example of which is illustrated in FIG. 2. In FIG. 4, the vertical axis represents the voltage $V_{GE}$ [V], the voltage $V_{CE}$ [V], and the current IC [A] flowing through the IGBT, and the horizontal axis represents time [μs].

Further, in FIG. 4, the waveform shown by the solid line corresponds to the case where the external variable capacitor $C_{GC}$ is 0, and the waveform shown by the dotted line corresponds to the case where the external variable capacitor $C_{GC}$ is 50 nF.

Referring to FIGS. 3 and 4, adjustment in the characteristics of the turn-off operation as illustrated in FIG. 3 is executed by varying the value of the external variable capacitor $C_{GC}$ between the gate and the collector. However, at the same time, as illustrated in FIG. 4, an unintended change in the characteristics of the turn-on operation has occurred.

The characteristics of the switching operation are determined by the accumulation time and discharge time of charge to the gate electrode; therefore, simulating the switching operation with high accuracy is hard to attain with the adjustment method with the external variable capacitor $C_{dg}$ (external variable capacitor $C_{GC}$) which follows the time variation of the drain-gate voltage $V_{dg}$ (the gate-collector voltage $V_{GC}$).

<Simulation Circuit>

Figure 5:
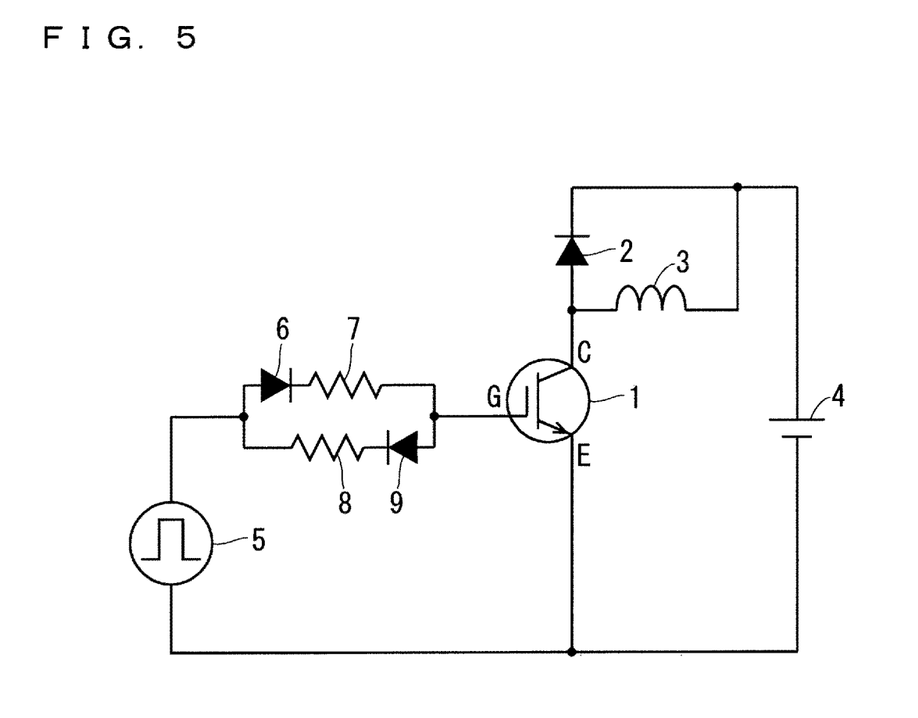
FIG. 5 is a circuit diagram of the simulation circuit using for switching simulation of the IGBT relating to Embodiment.

FIG. 5 is a circuit diagram of the simulation circuit using for the switching simulation of an IGBT of Embodiment 1. As an example illustrated in FIG. 5, an IGBT 1 of Embodiment 1 includes a gate terminal G, an emitter terminal E, and a collector terminal C.

A gate power supply 5 for applying a voltage to the gate terminal G of the IGBT 1, a diode 6, a gate resistor 7, a gate resistor 8 and a diode 9 are connected between the gate terminal G and the emitter terminal E of the IGBT 1.

The gate power supply 5 is connected to the emitter terminal E of the IGBT 1 and the anode terminal of the diode 6. The gate resistor 7 is connected to the cathode terminal of the diode 6 and the gate terminal G of the IGBT 1.

The gate resistor 8 is connected to the gate power supply 5 and the cathode terminal of the diode 9. The anode terminal of the diode 9 is connected to the gate terminal G of the IGBT 1.

Here, the diode 6 and the gate resistor 7 are connected in series. And, the gate resistor 8 and the diode 9 are connected in series. Also, the diode 6 and the gate resistor 7 are connected in antiparallel with the gate resistor 8 and the diode 9.

The capacitance of the diode 6 and the capacitance of the diode 9 have dependency on the current flowing between the collector and the emitter during the switching operation of the IGBT 1 and the temperature during the operation of the IGBT 1.

Further, the capacitance of the diode 6 and the capacitance of the diode 9 are variable independently from each other.

Further, a diode 2, a load inductance 3, and a high voltage power supply 4 are connected between the collector terminal C and the emitter terminal E of the IGBT 1.

The anode terminal of the diode 2 is connected to the collector terminal C of the IGBT 1. Also, the cathode terminal of the diode 2 is connected to the high voltage power supply 4.

Further, the load inductance 3 is connected in parallel with the diode 2. Also, the high voltage power supply 4 is connected to the emitter terminal E of the IGBT 1.

<Simulation Method>

Next, the turn-on operation and the turn-off operation of the IGBT 1 in the simulation circuit used for the switching simulation, an example of which is illustrated in FIG. 5 will be described.

First, in the turn-on operation of the IGBT 1, the gate power supply 5 is turned on, and charge is accumulated in the gate electrode of the IGBT 1 through the diode 6 and the gate resistor 7.

When the charge accumulation in the gate electrode of the IGBT 1 is started, the collector-emitter of the IGBT 1 becomes conductive (on state) at a certain time. The time until the IGBT 1 switches to the conductive state depends on the gate capacitance of the IGBT 1 and the capacitance of the diode 6.

Subsequently, in the turn-off operation of the IGBT 1, the gate power supply 5 is turned off, and the charge accumulated in the gate electrode of the IGBT 1 starts to be discharged through the diode 9 and the gate resistor 8.

Then, the collector-emitter of the IGBT 1 is interrupted (off state) at a certain time. The time until the IGBT 1 switches to the interruption state depends on the gate capacitance of the IGBT 1 and the capacitance of the diode 9.

That is, in the turn-on operation, the capacitance of the diode 6 is useable as the adjustment parameter, and in the turn-off operation, the capacitance of the diode 9 is useable as the adjustment parameter. Therefore, individual adjustment of the turn-on operation and the turn-off operation can be made.

The characteristics of the turn-on operation change due to the change of the capacitance of the diode 6, and the characteristics of the turn-off operation change due to the change of the capacitance of the diode 9. Therefore, there is a necessity of incorporation of a variable capacitor model that follows changes in current or temperature during actual device operation into the switching simulation.

The inventors found the relationship between the current and temperature during the operation of the IGBT and the capacitance matching with the measured waveform, as the example illustrated in FIGS. 6 to 9. Then, a model that is defined by a function of current and temperature shown in the following Expression 1 and Expression 2 has been devised. Note that, $C_{di(on)}$ in Expression 1 represents capacitance that changes the characteristics of the turn-on operation, and $C_{di(off)}$ in Expression 2 represents capacitance that changes the characteristics of the turn-off operation.

[Expression 1]

$$C_{di(on)} = A^* J_c - B \quad (1)$$

[Expression 2]

$$C_{di(off)} = C^* J_c - D^* \exp(E^* T) \quad (2)$$

Here, $J_c$ represents the current density during the operation of the IGBT, T represents the temperature during the operation of the IGBT, and A, B, C, D, and E each represent a constant.

Figure 6:
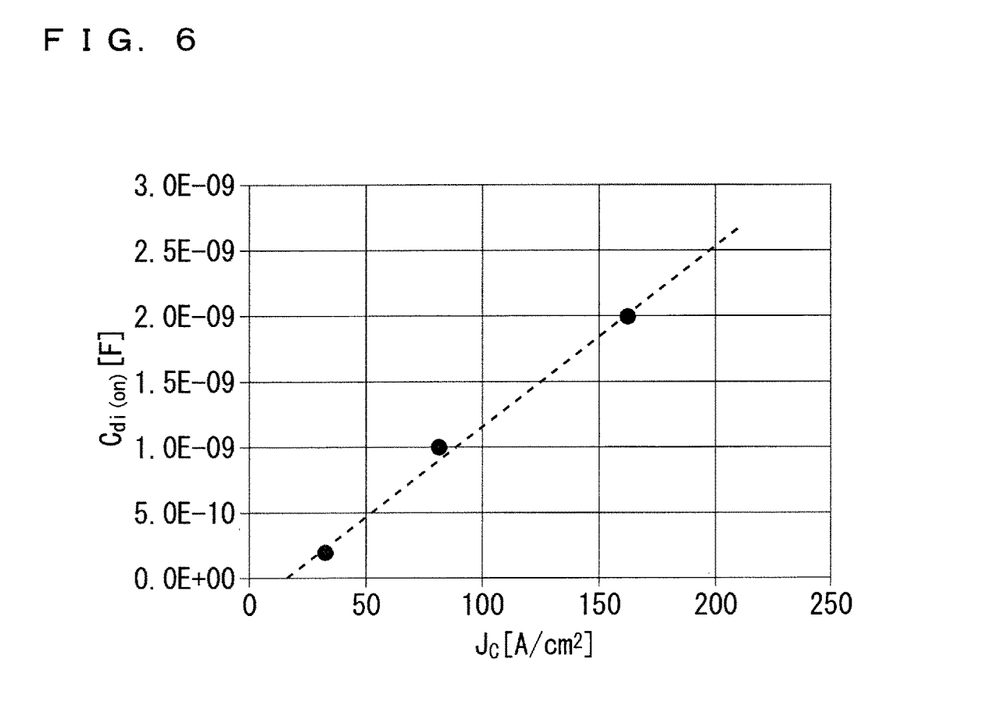
FIG. 6 is a graph illustrating the correlation between the current value and the capacitance of a diode at the turn-on operation of the IGBT.

FIG. 6 is a graph illustrating the correlation between the current value and the capacitance of the diode 6 at the turn-on operation of the IGBT. In FIG. 6, the vertical axis represents the capacitance [F] of the diode 6, and the horizontal axis represents the current density [A/cm²] at the time of turn-on operation of the IGBT. As illustrated in FIG. 6, the current value and the capacitance of the diode 6 during the turn-on operation of the IGBT have a certain correlation.

Figure 7:
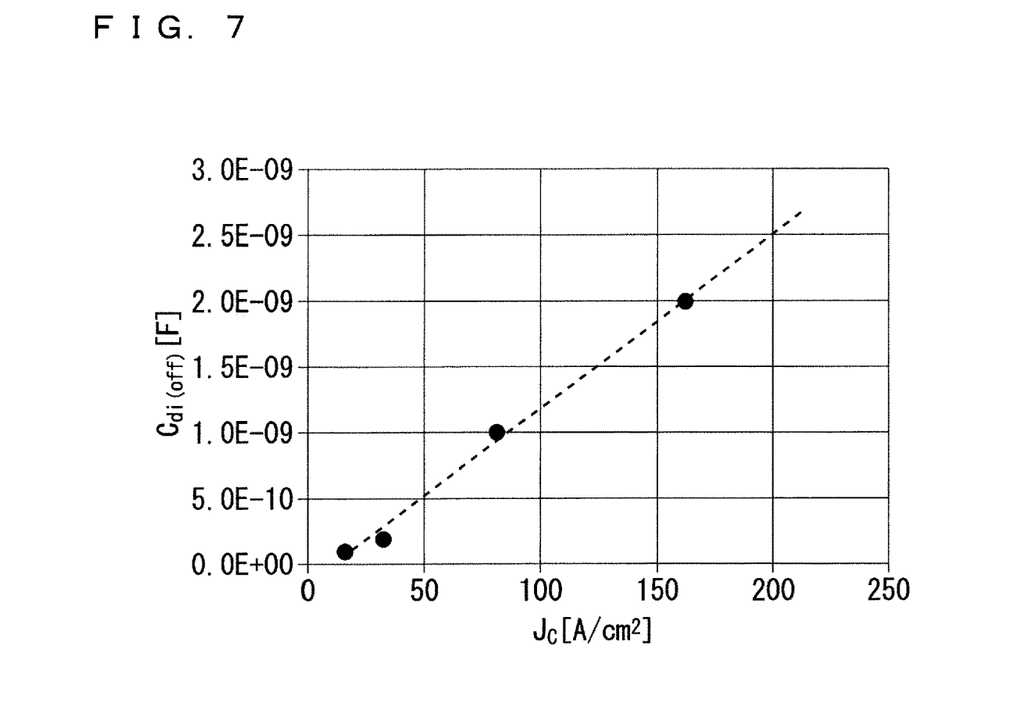
FIG. 7 is a graph illustrating the correlation between the current value and the capacitance of the diode at the turn-off operation of the IGB.

FIG. 7 is a graph illustrating the correlation between the current value and the capacitance of the diode 9 at the turn-off operation of the IGBT. In FIG. 7, the vertical axis represents the capacitance [F] of the diode 9, and the horizontal axis represents the current density [A/cm²] at the time of turn-off operation of the IGBT. As illustrated in FIG. 7, the current value and the capacitance of the diode 9 during the turn-off operation of the IGBT have a certain correlation.

Figure 8:
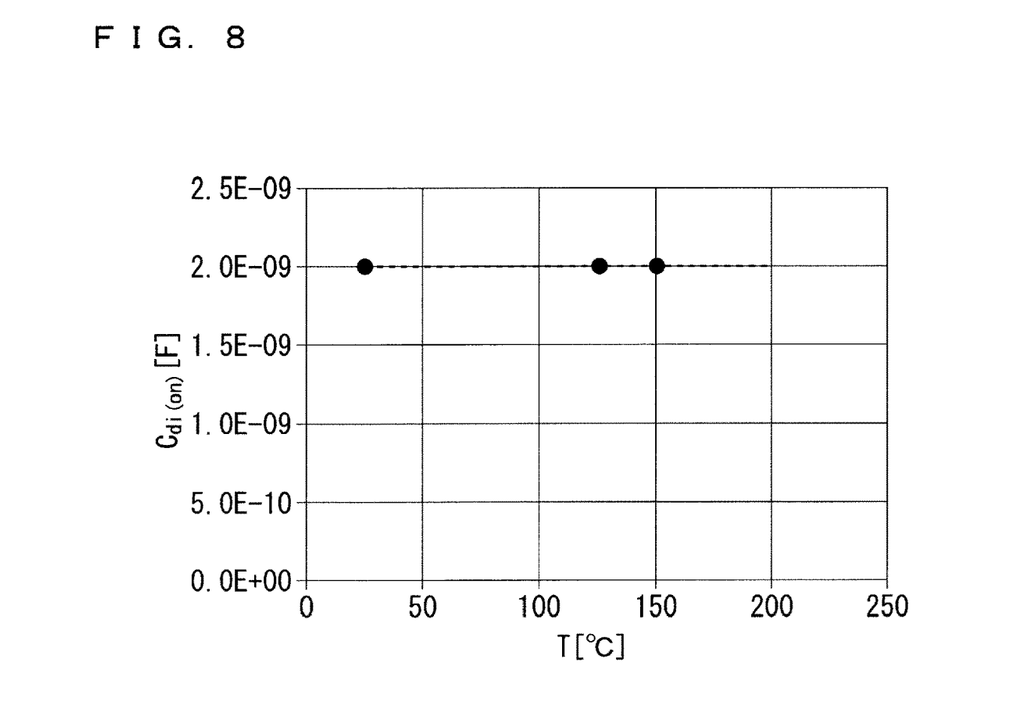
FIG. 8 is a graph illustrating the correlation between the temperature and the capacitance of the diode at the turn-on operation of the IGBT.

FIG. 8 is a graph illustrating the correlation between the temperature and the capacitance of the diode 6 at the turn-on operation of the IGBT. In FIG. 8, the vertical axis represents the capacitance [F] of the diode 6, and the horizontal axis represents the temperature [° C.] at the time of turn-on operation of the IGBT. As illustrated in FIG. 8, with respect to changes in temperature during the turn-on operation of the IGBT, the capacitance of the diode 6 matching with the measured values is substantially a certain value.

Figure 9:
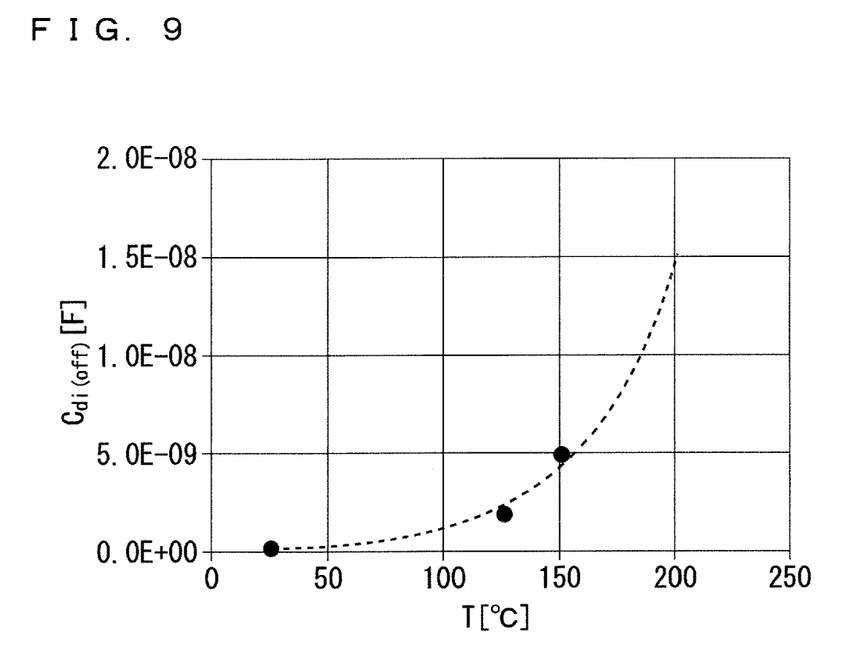
FIG. 9 is a graph illustrating the correlation between the temperature and the capacitance of the diode at the turn-off operation of the IGBT.

Also, FIG. 9 is a graph illustrating the correlation between the temperature and the capacitance of the diode 9 at the turn-off operation of the IGBT. In FIG. 9, the vertical axis represents the capacitance [F] of the diode 9, and the horizontal axis represents the temperature [° C.] at the time of turn-off operation of the IGBT. As illustrated in FIG. 9, the temperatures and the capacitance of the diode 9 during the turn-off operation of the IGBT have a certain correlation.

Figure 10:
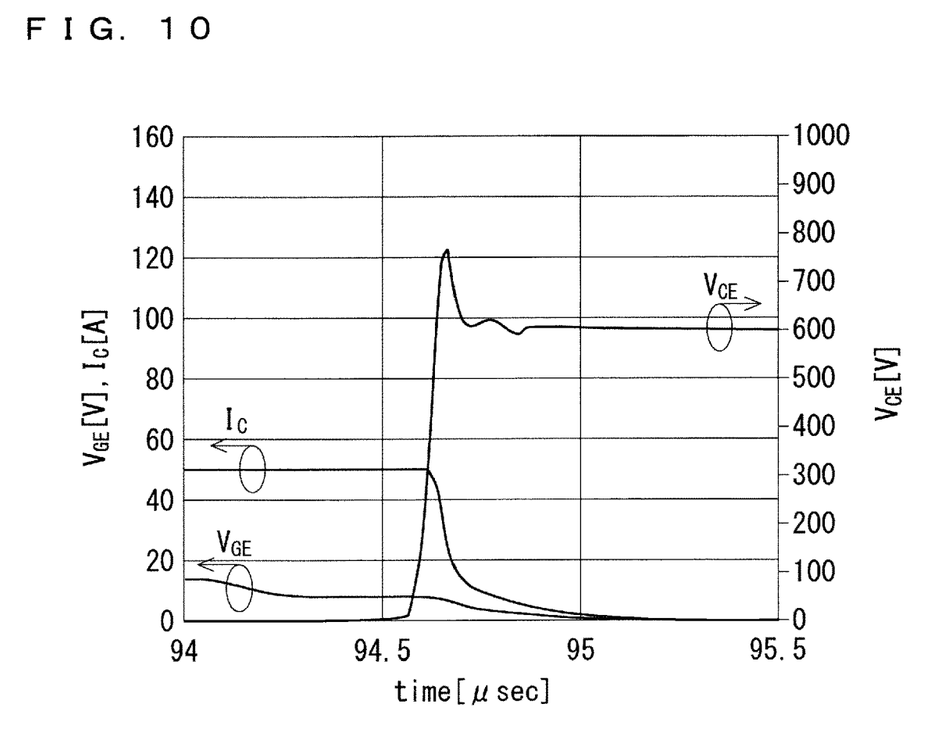
FIG. 10 is a graph showing the characteristics of the turn-off operation when the capacitor model of the diode represented by Expression 1 is incorporated only in the diode 6.

And, FIG. 10 is a graph showing the characteristics of the turn-off operation when the capacitor model of the diode represented by above Expression 1 is incorporated only in the diode 6. In FIG. 10, the vertical axis represents the gate-emitter voltage $V_{GE}$ [V], the collector-emitter voltage $V_{CE}$ [V], and the current IC [A] flowing through the IGBT, and the horizontal axis represents time [μs].

Further, in FIG. 10, the waveform shown by the solid line corresponds to the case where the capacitor model of above Expression 1 is not applied, and the waveform shown by the dotted line corresponds to the case where the capacitor model of above Expression 1 is applied. In FIG. 10, the waveform shown by the solid line and the waveform shown by the dotted line substantially overlap.

Figure 11:
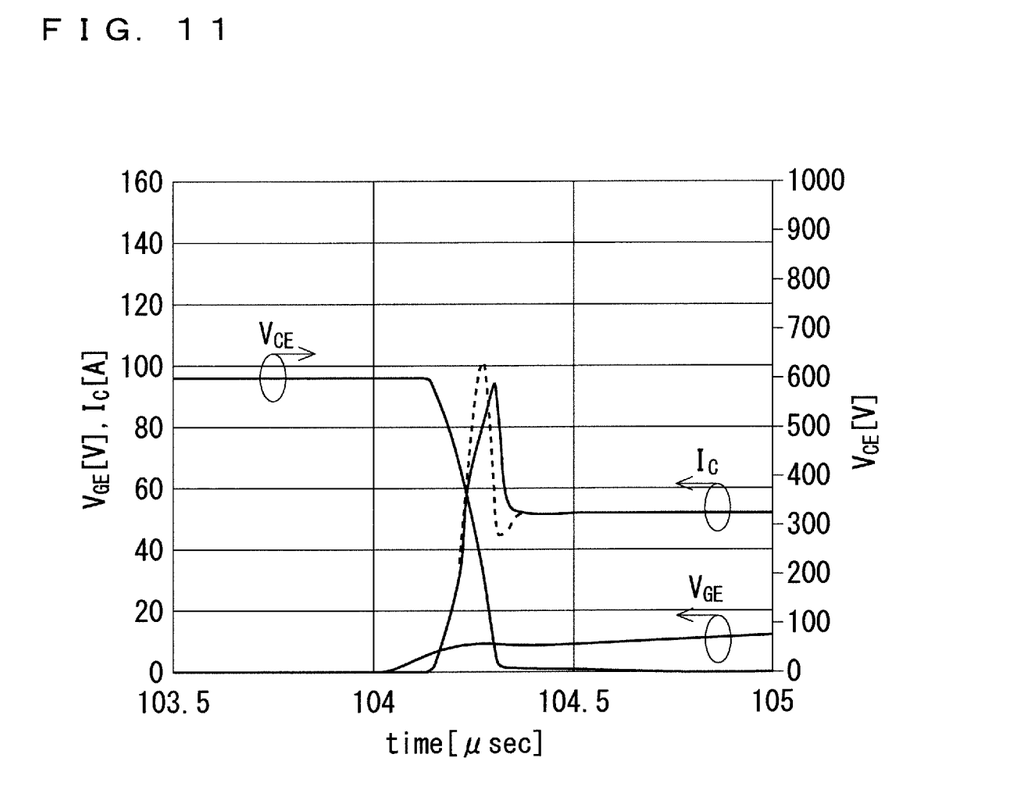
FIG. 11 is a graph showing the characteristics of the turn-on operation when the capacitor model of the diode represented by Expression 1 is incorporated only in the diode 6.

Also, FIG. 11 is a graph showing the characteristics of the turn-on operation when the capacitor model of the diode represented by above Expression 1 is incorporated only in the diode 6. In FIG. 11, the vertical axis represents the voltage $V_{GE}$ [V], the voltage $V_{CE}$ [V], and the current IC [A], and the horizontal axis represents time [μs].

Further, in FIG. 11, the waveform shown by the solid line corresponds to the case where the capacitor model of above Expression 1 is not applied, and the waveform shown by the dotted line corresponds to the case where the capacitor model of above Expression 1 is applied.

Figure 12:
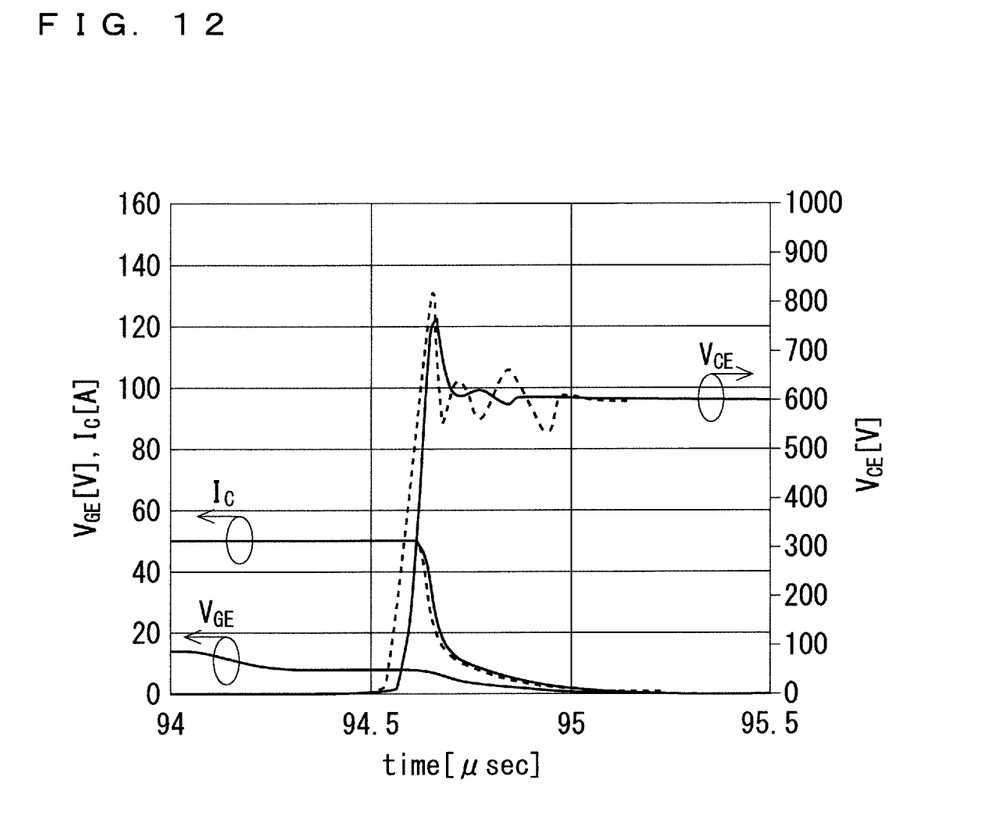
FIG. 12 is a graph showing the characteristics of the turn-off operation when the capacitor model of the diode represented by Expression 2 is incorporated only in the diode 9.

Further, FIG. 12 is a graph showing the characteristics of the turn-off operation when the capacitor model of the diode represented by above Expression 2 is incorporated only in the diode 9. In FIG. 12, the vertical axis represents the voltage $V_{GE}$ [V], the voltage $V_{CE}$ [V], and the current IC [A], and the horizontal axis represents time [μs].

Further, in FIG. 12, the waveform shown by the solid line corresponds to the case where the capacitor model of above Expression 2 is not applied, and the waveform shown by the dotted line corresponds to the case where the capacitor model of above Expression 2 is applied.

Figure 13:
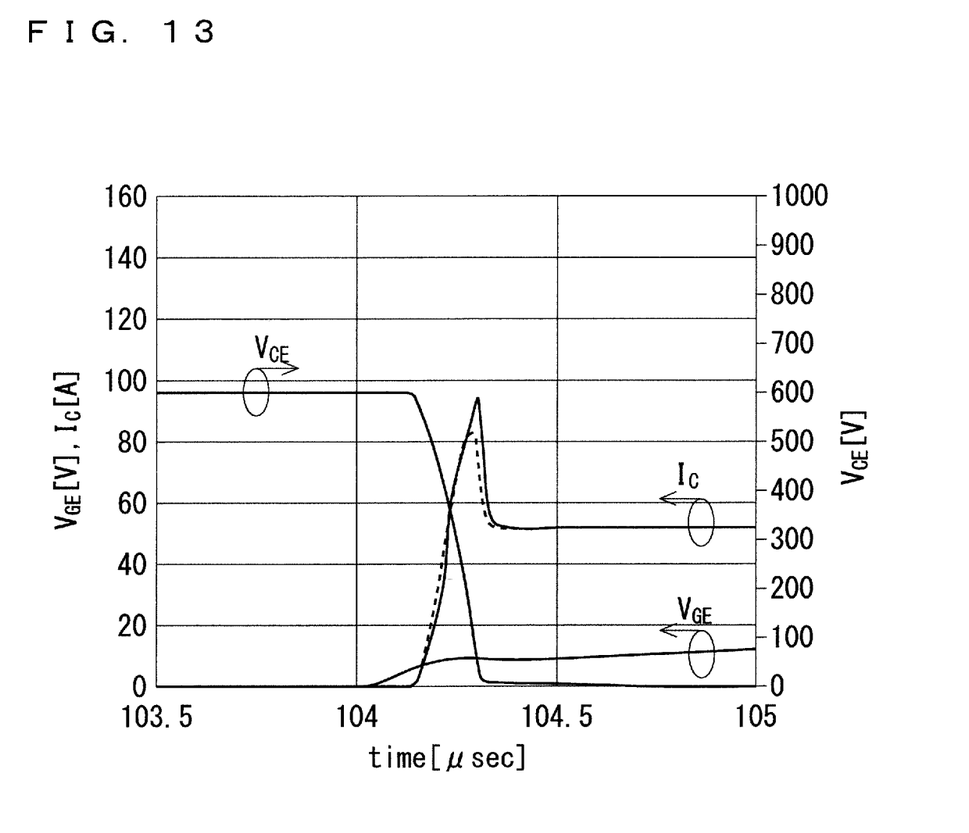
FIG. 13 is a graph showing the characteristics of the turn-on operation when the capacitor model of the diode represented by Expression 2 is incorporated only in the diode 9.

Also, FIG. 13 is a graph showing the characteristics of the turn-on operation when the capacitor model of the diode represented by above Expression 2 is incorporated only in the diode 9. In FIG. 13, the vertical axis represents the voltage $V_{GE}$ [V], the voltage $V_{CE}$ [V], and the current IC [A], and the horizontal axis represents time [μs].

Further, in FIG. 13, the waveform shown by the solid line corresponds to the case where the capacitor model of above Expression 2 is not applied, and the waveform shown by the dotted line corresponds to the case where the capacitor model of above Expression 2 is applied. In FIG. 13, the waveform shown by the solid line and the waveform shown by the dotted line substantially overlap.

Referring to FIGS. 10 and 11 corresponding to the case where the capacitor model of the diode is incorporated only in the diode 6, the dotted line waveform to which the capacitor model of Expression 1 is applied changes only the characteristics of the turn-on operation in FIG. 11.

Referring to FIGS. 12 and 13 corresponding to the case where the capacitor model of the diode is incorporated only in the diode 9, the dotted line waveform to which the capacitor model of Expression 2 is applied changes only the characteristics of the turn-off operation in FIG. 12.

That is, according to Embodiment 1, by varying the capacitance of diode 6, the characteristics of the turn-on operation can be adjusted without affecting the characteristics of the turn-off operation, and by varying the capacitance of diode 9, the characteristics of the turn-off operation can be adjusted without affecting the characteristics of the turn-on operation.

Embodiment 2

The simulation circuit of Embodiment 2 will be described. In the following description, the same components in above-described Embodiment are illustrated in the drawings with the same reference numerals, and detailed description thereof is appropriately omitted.

<Configuration of Simulation Circuit>

Figure 14:
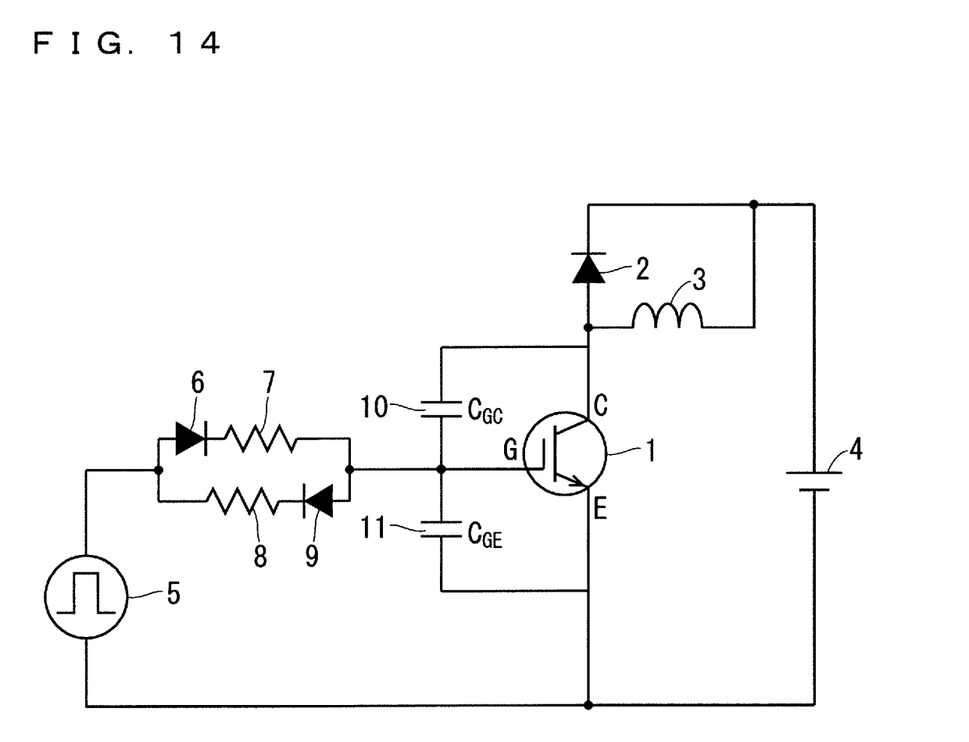
FIG. 14 is a circuit diagram of a simulation circuit using for switching simulation of the IGBT of Embodiment.

FIG. 14 is a circuit diagram of the simulation circuit using for the switching simulation of an IGBT of Embodiment 2. As an example illustrated in FIG. 14, an IGBT 1 of Embodiment 2 includes a gate terminal G, an emitter terminal E, and a collector terminal C.

A gate power supply 5, a diode 6, a gate resistor 7, a gate resistor 8 and a diode 9 are connected between the gate terminal G and the emitter terminal E of the IGBT 1.

Further, a diode 2, a load inductance 3 and a high voltage power supply 4 are connected between the collector terminal C and the emitter terminal E of the IGBT 1.

Further, in the configuration shown in FIG. 14, in addition to the configuration shown in FIG. 5, a variable capacitor $C_{GC}$ 10 is provided between the gate terminal G and the collector terminal C of the IGBT 1, and a variable capacitor $C_{GE}$ 11 is provided between the gate terminal G and the emitter terminal E. Note that, the variable capacitor $C_{GE}$ 11 is connected in parallel to the gate power supply 5, the diode 6, the gate resistor 7, the gate resistor 8, and the diode 9.

The variable capacitor $C_{GC}$ 10 and the variable capacitor $C_{GE}$ 11 are respectively expressed as the following Expressions 3 and 4 as a function of the current flowing between the collector and the emitter during the switching operation of the IGBT 1.

[Expression 3]

$$C_{GC} = F^* J_c + G \qquad (3)$$

[Expression 4]

$$C_{GE} = -H^* J_c + I \qquad (4)$$

Here, $J_c$ represents the current density during the operation of the IGBT and F, G, H, and I each represent a constant.

The capacitance value defined by Expression 3 and the capacitance value defined by Expression 2 are combined, and the capacitance value defined by Expression 4 and the capacitance value defined by Expression 1 are combined; therefore, this enables both of fine adjustment of the characteristics of the turn-on operation and fine adjustment of the characteristics of the turn-off operation.

Effects of Above-Described Embodiments

Next, examples of effects of above-described Embodiments will be described. In the following description, effects are described based on the specific configurations illustrated in the above described Embodiments, however, other specific configurations may be applied in replace of the configurations illustrated in the specification, within the scope of producing the similar effects.

Also, the replacement may be implemented across a plurality of Embodiments. That is, each of the configurations illustrated with the examples in the corresponding Embodiments may be combined one another to produce the similar effects.

According to the embodiment described above, the simulation circuit for simulation for evaluating the characteristics of a transistor includes the gate power supply 5, a first diode, and a second diode. Here, the transistor corresponds to, for example, the IGBT 1. And, the first diode corresponds to, for example, the diode 6. Also, the second diode corresponds to, for example, the diode 9. Then, the gate power supply 5 applies a voltage to the gate terminal G of the IGBT 1. Also, the diode 6 is connected between the gate terminal G and the gate power supply 9. Further, the diode 9 is connected in antiparallel with the diode 6.

According to such a configuration, by arranging the diode 6 and the diode 9 in antiparallel between the gate terminal G of the IGBT 1 and the gate power supply 5, during the turn-on operation of the IGBT 1, charge is accumulated in the gate electrode of the IGBT 1 through the diode 6 to which the anode terminal is connected on the gate power supply 5 side, and during the turn-off operation of the IGBT 1, charge accumulated in the gate electrode of the IGBT 1 is discharged through the diode 9 to which the cathode terminal is connected on the gate power supply 5 side. That is, in the turn-on operation and the turn-off operation, charging and discharging are executed through different paths. Therefore, by varying the capacitance of diode 6, the characteristics of the turn-on operation can be adjusted without affecting the characteristics of the turn-off operation, and by varying the capacitance of diode 9, the characteristics of the turn-off operation can be adjusted without affecting the characteristics of the turn-on operation.

It should be noted that, even in the case where at least one of the other configurations other than the configurations illustrated in the present specification is appropriately added to the configuration described above, that is, other configurations other than the configurations illustrated in the present specification, which are not referred to as configurations described above are appropriately added, the similar effects can be produced.

Further, according to Embodiments described above, the capacitance of the diode 6 and the capacitance of the diode 9 are variable independently from each other. According to such a configuration, by varying the capacitance of diode 6, the characteristics of the turn-on operation can be adjusted without affecting the characteristics of the turn-off operation, and by varying the capacitance of diode 9, the characteristics of the turn-off operation can be adjusted without affecting the characteristics of the turn-on operation.

Further, according to Embodiments described above, the capacitance of the diode 6 is determined based on the current flowing through the IGBT 1 when the IGBT 1 operates. According to such a configuration, the capacitance of the diode 6 is allowed to follow the current at the time of operation of the transistor; therefore, switching simulation that matches with the characteristics of the actual switching operation of the transistor with high accuracy can be executed.

Further, according to Embodiments described above, the capacitance of the diode 9 is determined based on the current flowing through the IGBT 1 when the IGBT 1 operates and on the temperature of the IGBT 1 when the IGBT 1 operates. According to such a configuration, the capacitance of the diode 9 is allowed to follow the current at the time of operation of the transistor and the temperature of the transistor at the time of operation of the transistor; therefore, switching simulation that matches with the characteristics of the actual switching operation of the transistor with high accuracy can be executed.

Also, according to Embodiments described above, the simulation circuit includes a first variable capacitor and a second variable capacitor. Here, the first variable capacitor corresponds to the variable capacitor $C_{GC}$ 10, for example. Also, the second variable capacitor corresponds to the variable capacitor $C_{GE}$ 11, for example. The variable capacitor $C_{GC}$ 10 is connected between the gate terminal and the collector terminal of the IGBT 1. The variable capacitor $C_{GE}$ 11 is connected between the gate terminal and the emitter terminal of the IGBT 1. According to such a configuration, the variable capacitor $C_{GC}$ 10 and the variable capacitor $C_{GE}$ 11 are used; therefore, this enables both of fine adjustment of the characteristics of the turn-on operation and fine adjustment of the characteristics of the turn-off operation.

Further, according to Embodiments described above, the capacitance of the variable capacitor $C_{GC}$ 10 is determined based on the current flowing through the IGBT 1 when the IGBT 1 operates. According to such a configuration, the capacitance of the variable capacitor $C_{GC}$ 10 is allowed to follow the current at the time of operation of the transistor; therefore, switching simulation that matches with the characteristics of the actual switching operation of the transistor with high accuracy can be executed.

Further, according to Embodiments described above, the capacitance of the variable capacitor $C_{GE}$ 11 is determined based on the current flowing through the IGBT 1 when the IGBT 1 operates. According to such a configuration, the capacitance of the variable capacitor $C_{GE}$ 11 is allowed to follow the current at the time of operation of the transistor; therefore, switching simulation that matches with the characteristics of the actual switching operation of the transistor with high accuracy can be executed.

According to Embodiments described above, in the simulation method for evaluating the characteristics of the IGBT 1, the characteristics of the IGBT 1 is evaluated using a simulation circuit including the gate power supply 5 that applies a voltage to the gate terminal G of the IGBT 1, the diode 6 connected between the gate terminal G and the gate power supply 5, and the diode 9 connected in antiparallel with the diode 6.

According to such a configuration, by arranging the diode 6 and the diode 9 in antiparallel between the gate terminal G of the IGBT 1 and the gate power supply 5, during the turn-on operation of the IGBT 1, charge is accumulated in the gate electrode of the IGBT 1 through the diode 6 to which the anode terminal is connected on the gate power supply 5 side, and during the turn-off operation of the IGBT 1, charge accumulated in the gate electrode of the IGBT 1 is discharged through the diode 9 to which the cathode terminal is connected on the gate power supply 5 side. That is, in each of the turn-on operation and the turn-off operation, charging and discharging are executed through different paths. Therefore, by varying the capacitance of diode 6, the characteristics of the turn-on operation can be adjusted without affecting the characteristics of the turn-off operation, and by varying the capacitance of diode 9, the characteristics of the turn-off operation can be adjusted without affecting the characteristics of the turn-on operation.

It should be noted that, even in the case where at least one of the other configurations other than the configurations illustrated in the present specification is appropriately added to the configuration described above, that is, other configurations other than the configurations illustrated in the present specification, which are not referred to as configurations described above are appropriately added, the similar effects can be produced.

Further, the order of implementation of the respective processes can be changed, unless otherwise specified.

Modification of Embodiments Described Above

In Embodiments described above, an IGBT is shown as an example of the driving transistor, and for such transistor a MOSFET is also useable as the driving transistor, for example.

In Embodiments described above, materials, material properties, dimensions, shapes, relative arrangement relations, conditions for implementation, and so forth for the respective components may be described, however, these represent a mare example in all aspects, and are not limited to the description in the specification.

Accordingly, it is understood that numerous other modifications variations, and equivalents can be devised without departing from the scope of the invention. For example, the following cases where at least one of the components is to be modified, added, or omitted, further, at least one of the components of at least one of Embodiments is extracted and then combined with components of other Embodiment, are involved.

Further, "one or more" may be included as a component described as "one" in Embodiments described above, so far as consistent with Embodiments.

Furthermore, each component in Embodiments described above is a conceptual unit, and within the scope of the technique disclosed in the present specification, a case where one component is composed of a plurality of structures, a case where one component corresponds to a part of a structure, and a case where a plurality of components are provided in one structure are included.

Further, each component in Embodiments described above include a structure having another structure or shape as long as the same function is exhibited.

Also, the descriptions in the present specification are referred for the every object related to the technique, and none of them are regarded as conventional techniques.

While the invention has been shown and described in detail, the foregoing description is in all aspects illustrative and not restrictive. It is therefore understood that numerous modifications and variations can be devised without departing from the scope of the invention.

What is claimed is:

1. A simulation circuit for simulation for evaluating characteristics of a transistor, comprising:
   a gate power supply configured to apply a voltage to a gate terminal of the transistor;
   a first diode connected between the gate terminal and the gate power supply; and
   a second diode connected in antiparallel with the first diode,
   wherein capacitance of the first diode and capacitance of the second diode are variable independently from each other, and
   wherein one of the following:
      the capacitance of the first diode is determined based on a current flowing through the transistor at a time of operation of the transistor; and
      the capacitance of the second diode is determined based on a current flowing through the transistor at a time of operation of the transistor and a temperature of the transistor at a time of operation of the transistor.

2. The simulation circuit according to claim 1, wherein the capacitance of the first diode is determined based on the current flowing through the transistor at the time of operation of the transistor.

3. The simulation circuit according to claim 1, wherein the capacitance of the second diode is determined based on the current flowing through the transistor at the time of operation of the transistor and the temperature of the transistor at the time of operation of the transistor.

4. The simulation circuit according to claim 3, further comprising:
   a first variable capacitor connected between the gate terminal and a collector terminal of the transistor; and
   a second variable capacitor connected between the gate terminal and an emitter terminal of the transistor.

5. The simulation circuit according to claim 1, further comprising:
   a first variable capacitor connected between the gate terminal and a collector terminal of the transistor; and
   a second variable capacitor connected between the gate terminal and an emitter terminal of the transistor.

6. The simulation circuit according to claim 5, wherein capacitance of the first variable capacitor is determined based on the current flowing through the transistor at the time of operation of the transistor.

7. The simulation circuit according to claim 6, wherein capacitance of the second variable capacitor is determined based on the current flowing through the transistor at the time of operation of the transistor.

8. The simulation circuit according to claim 5, wherein capacitance of the second variable capacitor is determined based on the current flowing through the transistor at the time of operation of the transistor.

9. A simulation method for evaluating characteristics of a transistor, comprising:
   evaluating the characteristics of the transistor by using a simulation circuit including a gate power supply configured to apply a voltage to a gate terminal of the transistor, a first diode connected between the gate terminal and the gate power supply, and a second diode connected in antiparallel with the first diode, wherein capacitance of the first diode and capacitance of the second diode are variable independently from each other, and
   wherein one of the following:
      the capacitance of the first diode is determined based on a current flowing through the transistor at a time of operation of the transistor; and
      the capacitance of the second diode is determined based on a current flowing through the transistor at a time of operation of the transistor and a temperature of the transistor at a time of operation of the transistor.

10. The simulation method according to claim 9, wherein the capacitance of the first diode is determined based on the current flowing through the transistor at the time of operation of the transistor.

11. The simulation method according to claim 9, wherein the capacitance of the second diode is determined based on the current flowing through the transistor at the time of operation of the transistor and the temperature of the transistor at the time of operation of the transistor.

12. A simulation circuit for simulation for evaluating characteristics of a transistor, comprising:
   a gate power supply configured to apply a voltage to a gate terminal of the transistor;
   a first diode connected between the gate terminal and the gate power supply;

a second diode connected in antiparallel with the first diode;
a first variable capacitor connected between the gate terminal and a collector terminal of the transistor; and
a second variable capacitor connected between the gate terminal and an emitter terminal of the transistor.

13. The simulation circuit according to claim 12, wherein capacitance of the first variable capacitor is determined based on a current flowing through the transistor at a time of operation of the transistor.

14. The simulation circuit according to claim 12, wherein capacitance of the second variable capacitor is determined based on a current flowing through the transistor at a time of operation of the transistor.

* * * * *